(12) United States Patent
Kiessling et al.

(10) Patent No.: US 11,367,691 B2
(45) Date of Patent: Jun. 21, 2022

(54) ELECTRONIC SEMICONDUCTOR COMPONENT AND METHOD FOR PRODUCING AN ELECTRONIC SEMICONDUCTOR COMPONENT

(71) Applicant: OSRAM OLED GmbH, Regensburg (DE)

(72) Inventors: Matthias Kiessling, Bad Abbach (DE); Andreas Reith, Steinach (DE)

(73) Assignee: OSRAM OLED GmbH, Regensburg (DE)

( * ) Notice: Subject to any disclaimer, the term of this patent is extended or adjusted under 35 U.S.C. 154(b) by 0 days.

(21) Appl. No.: 17/054,730

(22) PCT Filed: Jul. 8, 2019

(86) PCT No.: PCT/EP2019/068266
§ 371 (c)(1),
(2) Date: Nov. 11, 2020

(87) PCT Pub. No.: WO2020/011716
PCT Pub. Date: Jan. 16, 2020

(65) Prior Publication Data
US 2021/0249358 A1    Aug. 12, 2021

(51) Int. Cl.
*H01L 23/544* (2006.01)

(52) U.S. Cl.
CPC .. *H01L 23/544* (2013.01); *H01L 2223/54406* (2013.01); *H01L 2223/54413* (2013.01); *H01L 2223/54433* (2013.01); *H01L 2223/54486* (2013.01)

(58) Field of Classification Search
CPC ............ H01L 23/544; H01L 2223/544; H01L 2223/54406; H01L 2223/54413; H01L 2223/5442; H01L 2223/54433; H01L 2223/54486
See application file for complete search history.

(56) References Cited

U.S. PATENT DOCUMENTS

| 2003/0047806 A1 | 3/2003 | Stetzl et al. |
| 2008/0101034 A1* | 5/2008 | Loon ...................... H01L 23/544 |
| | | 361/719 |
| 2009/0104415 A1 | 4/2009 | Schmajew et al. |
| 2009/0236739 A1* | 9/2009 | Chen ...................... H01L 23/544 |
| | | 257/737 |

(Continued)

FOREIGN PATENT DOCUMENTS

| JP | H05-109918 A | 4/1993 |
| JP | 2008-251758 A | 10/2008 |

*Primary Examiner* — Brigitte A Paterson
*Assistant Examiner* — Molly K Reida
(74) *Attorney, Agent, or Firm* — Arentfox Schiff LLP

(57) ABSTRACT

An electronic semiconductor component with a housing structure and a cavity introduced into the housing structure is specified. The cavity comprises a base surface. Furthermore, the electronic semiconductor component comprises an auxiliary layer arranged on the base surface of the cavity and a marking penetrating the auxiliary layer at least as far as the base surface of the cavity. The marking comprises an optical contrast that depends on both an optical property of the housing structure and an optical property of the auxiliary layer. Furthermore, a method for producing an electronic semiconductor component is given.

13 Claims, 2 Drawing Sheets

(56) References Cited

U.S. PATENT DOCUMENTS

Figure 1A:
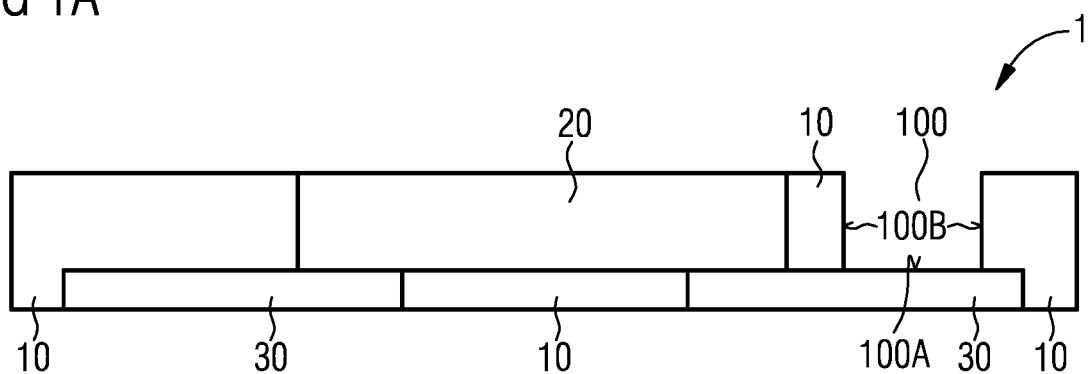

2014/0017822 A1 1/2014 Sakai et al.
2015/0294870 A1 10/2015 Fujisawa et al.
2017/0243831 A1 8/2017 Butler et al.

\* cited by examiner

ELECTRONIC SEMICONDUCTOR COMPONENT AND METHOD FOR PRODUCING AN ELECTRONIC SEMICONDUCTOR COMPONENT

This application is a 35 U.S.C. § 371 National Phase of PCT Application No. PCT/EP2019/068266, filed Jul. 8, 2019, which claims priority to DE Application No. 10 2018 116 821.7 filed Jul. 11, 2018, the disclosures of which are hereby incorporated by reference in their entireties.

An electronic semiconductor component and a method for producing an electronic semiconductor component are specified.

A task to be solved is to specify an electronic semiconductor component which comprises an improved marking.

A further task to be solved is to specify a method for the production of an electronic semiconductor component which comprises an improved marking.

According to at least one embodiment, the electronic semiconductor component comprises a housing structure with a cavity introduced into the housing structure. The housing structure is preferably formed with an electrically insulating material and is intended to protect, for example, a semiconductor chip from external environmental influences. Synthetic resin, silicone or a plastic is particularly suitable as an electrically insulating material for the housing structure. The housing structure is preferably produced by means of an injection molding, compression molding or transfer molding process. The cavity introduced into the housing structure comprises a base surface which is surrounded by side surfaces. In particular, the cavity can comprise the shape of a truncated cone, a truncated pyramid, a cylinder or a cuboid. The base surface of the cavity is therefore a triangle, an ellipse or a rectangle. The cavity extends transverse to a main extension plane of the housing structure, preferably in the direction of the normal vector of the main extension plane of the housing structure.

According to at least one embodiment, the electronic semiconductor component comprises an auxiliary layer, which is arranged on the base surface of the cavity.

According to at least one embodiment of the electronic semiconductor component, the electronic semiconductor component comprises a marking which penetrates the auxiliary layer at least up to the base surface of the cavity. The auxiliary layer "penetrating" here and in the following means that under the auxiliary layer the material of the housing structure is at least partially exposed. The marking does not have to stop at the material of the housing structure, but can also extend further into the housing structure. In particular, the marking is created by a laser ablation process. The marking can be designed, for example, as an alphanumeric character string, as a one-dimensional bar code or as a two-dimensional matrix, especially in the form of a QR Code or a DataMatrix. Furthermore, the marking can also combine such character strings or codes. Such a marking can be used for the identification of semiconductor components. This allows advantageously the monitoring of the production process or a later sorting of the components according to given criteria. Furthermore, the marking comprises an optical contrast, which depends on an optical property of the housing structure as well as on an optical property of the auxiliary layer.

According to at least one embodiment, the electronic semiconductor component comprises a housing structure,
a cavity introduced into the housing structure, which comprises a base surface,
an auxiliary layer, which is arranged on the base surface of the cavity, and
a marking penetrating the auxiliary layer to at least the base surface of the cavity, the marking comprising an optical contrast which depends on both an optical property of the housing structure and an optical property of the auxiliary layer.

An electronic semiconductor component described here is based, among other things, on the following considerations: To identify a component, for example during its production process or a subsequent quality control, a marking can be applied to the component. Advantageously, this marking can also be read out by machine, which is often convenient, especially when producing in large quantities. For a fast marking of large quantities a laser engraving can be used. A laser engraving is based on a laser ablation process and usually creates a topology in the surface of a body that is easily recognizable under a grazing incidence of light. However, the readability can be difficult under a non-grazing incidence of light. In particular, difficulties arise when the marking is arranged within a cavity, since grazing light incidence is difficult to realize.

The electronic semiconductor component described here makes use, among other things, of the idea of creating a marking with a high contrast by using an additional auxiliary layer. The auxiliary layer increases the contrast compared to the base surface of the cavity below the auxiliary layer and thus enables improved readability of the marking solely due to the contrast. Thus, advantageously, a grazing incidence of light can be dispensed with, which makes it easier to reliably recognize a marking on the base surface of a cavity.

According to at least one embodiment of the electronic semiconductor component, the auxiliary layer increases the optical contrast of the marking. The optical contrast of the marking results from the optical contrast between the material of the auxiliary layer and the material exposed by the marking. In this context, the term "increased" means a higher contrast compared to a marking of the same type, in particular of the same depth, which is formed directly in the base surface of the cavity without an auxiliary layer and which otherwise has the same illumination and recognition arrangement. A high contrast makes it easier for an observer or a camera system to recognize a pattern due to differences in brightness in different regions.

According to at least one embodiment of the electronic semiconductor component, the housing structure comprises a leadframe. A leadframe is used for the electrical contacting of the semiconductor component and is also a mechanically supporting part. A leadframe is formed with an electrically conductive material, in particular with metal or consists of a metal. In particular, the leadframe is at least partially embedded in the material of the housing structure. The housing structure comprises, for example, a housing body that at least partially surrounds the leadframe. Preferably, the auxiliary layer is formed with the material of the housing body. The housing body can be made in one piece or in several pieces, for example in the form of several layers lying on top of each other. In addition, a material can be selected for the layer with which the base surface of the cavity is formed, which enables a high optical contrast of the marking.

According to at least one embodiment of the electronic semiconductor component, the marking penetrates the auxiliary layer in such a way that underlying regions of the housing structure are exposed. In particular, the marking penetrates the auxiliary layer in such a way that a leadframe underneath is exposed. The metallically bright leadframe can advantageously comprise a particularly high optical contrast to the auxiliary layer.

According to at least one embodiment of the electronic semiconductor component, the auxiliary layer comprises ablation marks of a laser ablation process. In a laser ablation process, material is melted, vaporized and/or sublimated. Ablation marks of a laser ablation process can therefore be, for example, residues of vaporized or melted material at the edges of the processed region.

According to at least one embodiment of the electronic semiconductor component, the optical property of the housing structure and/or the auxiliary layer is the averaged absorption or maximum absorption of the housing structure and/or the auxiliary layer in a given wavelength range. The given wavelength range can be in particular the spectral range perceptible by an observer or a camera system. For a human eye it is the visible spectral range, while a camera system can also cover a much larger spectral range. The averaged absorption describes the absorption averaged over the given wavelength range. The maximum absorption describes the maximum value of absorption within the given wavelength range.

According to at least one embodiment of the electronic semiconductor component, the electronic semiconductor component is an optoelectronic semiconductor component. An optoelectronic semiconductor component is intended in particular for the emission or detection of electromagnetic radiation. Preferably, the optoelectronic semiconductor component may comprise a light emitting diode and a luminescence conversion material and may be intended for the emission of mixed white radiation.

According to at least one embodiment of the electronic semiconductor component, the cavity is at least 100 µm deep. Preferably, the depth of the cavity is at least 200 µm, and especially preferred at least 500 µm. The depth of the cavity describes the distance of the base surface of the cavity to the upper edge of the cavity along a normal vector of the cavity base surface. For example, a cavity with a maximum depth in the housing structure can facilitate the ejection of the housing structure from an injection mold. A deeper cavity also provides better protection of a marking placed on the base surface of the cavity against environmental influences and damage.

According to at least one embodiment of the electronic semiconductor component, the auxiliary layer is formed with at least one of the following materials: resin, silicone, plastic. The material of the auxiliary layer is particularly well suited for selective removal by means of a laser ablation process. This means that the material of the auxiliary layer preferably comprises a lower ablation threshold for laser radiation than the material arranged below the auxiliary layer. Furthermore, an auxiliary layer formed in this way comprises a sufficiently high adhesion to materials usually used for the housing structure.

According to at least one embodiment of the electronic semiconductor component, the auxiliary layer comprises a dark grey or black appearance for the human observer. A dark or black colored plastic layer, for example, produces an advantageously high contrast compared to a metallically bright background.

According to at least one embodiment of the electronic semiconductor component, the auxiliary layer is formed as a mold layer. In particular, a mold layer describes a layer of a plastic material applied in an injection molding or transfer molding process. Preferably, the auxiliary layer is formed as a dark gray or black mold layer.

Furthermore, a method for producing an electronic semiconductor component is given. In particular, the method can be used to produce an electronic semiconductor component described here. This means that all features disclosed for the electronic semiconductor component are also disclosed for the method and vice versa.

According to at least one embodiment of a method for producing an electronic semiconductor component, the auxiliary layer is arranged in the cavity by one of the following methods: jetting, dispensing, doctor blading, molding.

According to at least one embodiment of a method for producing an electronic semiconductor component, the housing structure and the auxiliary layer are produced in a single method step. This advantageously eliminates an additional process step for the production of the auxiliary layer. In particular, the auxiliary layer and the housing structure are produced together in an injection molding, compression molding or transfer molding method.

According to at least one embodiment of a method for producing an electronic semiconductor component with a housing structure, the method comprises steps in which a marking is introduced into a cavity of the housing structure by means of a laser ablation process and the marking is read and processed automatically. A process designed in such a way enables an advantageously fast and low-error machine detection of individual components. Reliable recognition of individual components is particularly important, for example, for subsequent sorting of the components according to their respective properties.

Further advantages and advantageous designs and further embodiments of the electronic semiconductor component result from the following, in connection with the exemplary embodiments shown in the figures.

Figure 1B:
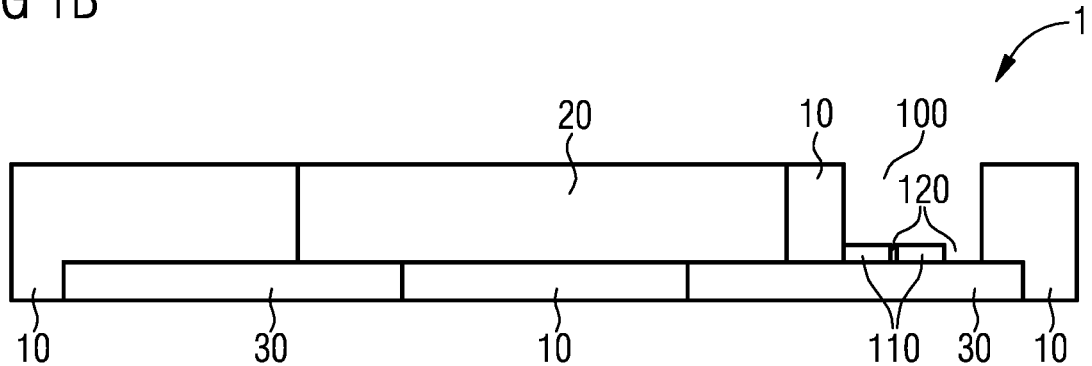
Figure 2:
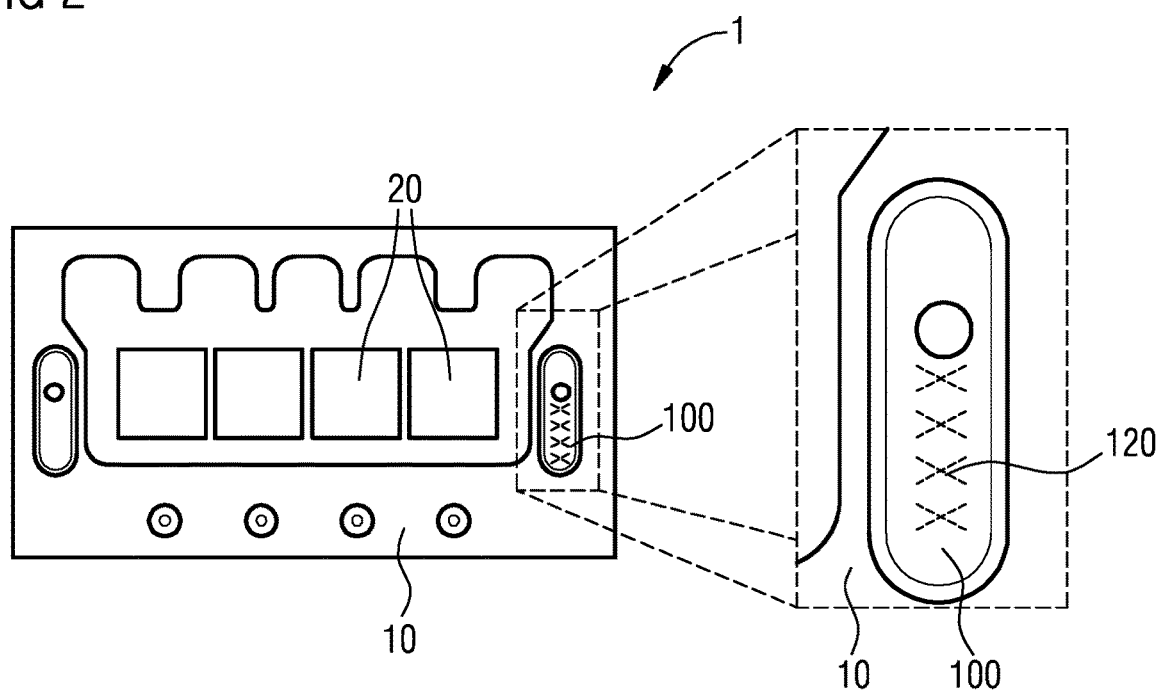
Figure 3:
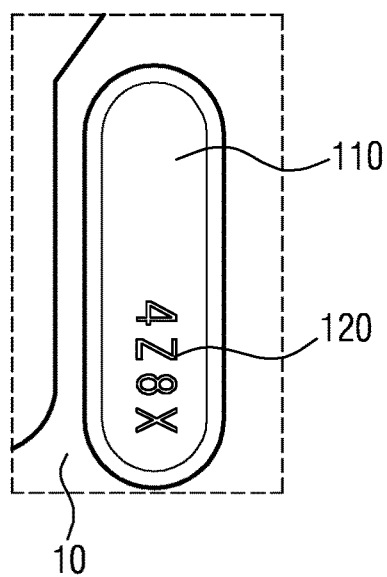
Figure 4:
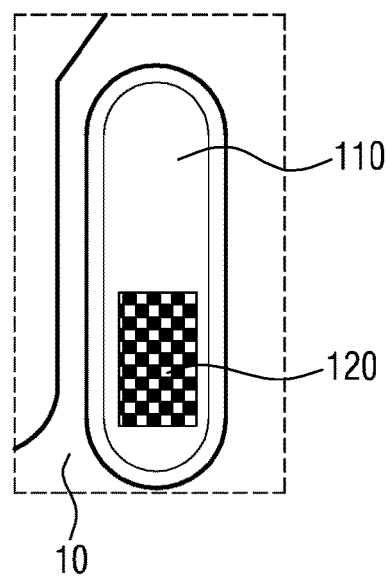

Showing in:

FIGS. 1A and 1B schematic cross-sections through an electronic semiconductor component described here according to a first exemplary embodiment in different steps of a method for its production, FIG. 2 a top view of an electronic semiconductor component with an enlarged section of it, FIG. 3 a top view of an enlarged section of an electronic semiconductor component described here according to the first exemplary embodiment, and FIG. 4 a top view of an enlarged section of an electronic semiconductor component described here according to a second exemplary embodiment.

Identical, similar or similar-acting elements are marked with the same reference signs in the figures. The figures and the proportions of the elements shown in the figures to each other are not to be regarded as true to scale. Rather, individual elements may be oversized for better representability and/or for better comprehensibility.

FIG. 1A shows a schematic cross section of an electronic semiconductor component 1 described here according to the first exemplary embodiment in one step of a method for its production. The electronic semiconductor component 1 shown here comprises a semiconductor chip 20 and a housing structure 10. The housing structure 10 is formed with a dark-colored plastic and serves in particular as mechanical protection of the semiconductor chip 20. A leadframe 30 is arranged on the side of the housing structure 10 facing away from the semiconductor chip 20. The leadframe 30 is made of metal and is electrically conductive. The semiconductor chip 20 is electrically conductively contacted via leadframe 30. Furthermore, the housing structure 10 comprises a cavity 100. The cavity 100 is cylindrical in shape and comprises a base surface 100A and side surfaces 100B. In the housing structure 10, the cavity 100 extends from the side of the housing structure 10 facing away from the leadframe 30 to the leadframe 30. In other words, the cavity 100 exposes the material of the leadframe 30.

FIG. 1B shows a schematic cross-section of an electronic semiconductor component 1 described here according to the first exemplary embodiment in a further step of a method for its production. In this step, an auxiliary layer 110 is arranged in the cavity 100 on the base surface 100A of the cavity 100. The auxiliary layer 110 is formed with a dark plastic and can be applied to the base surface 100A of the cavity 100 by means of jetting, dispensing, molding or doctor blading, for example. A marking 120 is introduced into the auxiliary layer 110, for example by means of a laser engraving method. In this process, a laser beam is used to remove material from the auxiliary layer 110 in a locally limited region to create the marking 120. The marking 120 extends completely through the auxiliary layer 110 and thus exposes the material of the leadframe 30 lying beneath the auxiliary layer 110. This results in an advantageously high optical contrast between the metallically bright leadframe 30 and the dark material of the auxiliary layer 110. This facilitates reliable recognition of the marking 120, especially by means of an automatic detection process.

FIG. 2 shows a schematic light microscope image of an electronic semiconductor component 1 without an auxiliary layer, which is shown for comparison. The electronic semiconductor component 1 comprises several semiconductor chips 20, which are configured to generate electromagnetic radiation. The semiconductor chips 20 are arranged in a housing structure 10, which comprises a cavity 100. The cavity 100 comprises a base surface 100A and extends through the housing structure 10 in such a way that a leadframe 30 arranged in the housing structure 10 is partially exposed. On the base surface 100A of the cavity 100, a marking 120 is introduced into the material of the leadframe 30. The marking 120 is created by a laser engraving method. FIG. 2 also shows an enlarged section of the schematic light microscope image of the marking 120 in the cavity 100. The marking 120 is difficult to see because it is only engraved into the material of leadframe 30 and therefore does not comprise a high optical contrast. The arrangement of the marking 120 within the cavity 100 prevents grazing light incidence. The low contrast impairs the readability of the marking 120 to such an extent that a high error rate must be expected when reading the marking 120 by a machine.

For comparison, FIG. 3 shows an enlarged section of an electronic semiconductor component 1 with an auxiliary layer described here in accordance with the structure shown in FIG. 1. The marking 120 comprises an alphanumeric character sequence for the identification of the electronic semiconductor component 1. The leadframe 30, which is located under the auxiliary layer 110, has a significantly lower absorption coefficient for light in the visible wavelength range due to its metallically bright surface than the material of the auxiliary layer 110. This results in a high contrast for an observer or a camera system. The large difference in contrast compared to the comparative section of an electronic semiconductor component 1 without an auxiliary layer 110 shown in FIG. 2 is clearly recognizable. The marking 120 in FIG. 3 is easier and more reliably recognizable with a machine readout method than the marking 120 shown in FIG. 2.

FIG. 4 shows a further enlarged section of an electronic semiconductor component 1 described here. Instead of the alphanumeric marking 120 in FIG. 2B, the marking 120 comprises a two-dimensional matrix, which can be designed as a QR-code, for example. A QR-code marking 120 has the advantage that a higher information density and also a certain error tolerance, caused by redundancies in the QR-code, can be achieved. A two-dimensional marking 120 can be easily read, especially by a machine readout method.

The invention is not limited by the description based on the exemplary embodiments. Rather, the invention comprises each new feature as well as each combination of features, which in particular includes each combination of features in the claims, even if this feature or this combination itself is not explicitly stated in the claims or exemplary embodiments.

This patent application claims the priority of the German patent application 102018116821.7, the disclosure content of which is hereby incorporated by reference.

LIST OF REFERENCE SIGNS 1 electronic semiconductor component
10 housing structure
100 cavity
100A cavity base surface
100B cavity side surface
110 auxiliary layer
120 marking
20 semiconductor chip
30 leadframe

The invention claimed is:

1. An electronic semiconductor component with
a housing structure comprising a leadframe,
a cavity inserted into the housing structure, which comprises a base surface,
an auxiliary layer disposed on the base surface of the cavity, and
a marking penetrating the auxiliary layer to at least the base surface of the cavity, wherein the marking comprises an optical contrast which depends on both an optical property of the housing structure and an optical property of the auxiliary layer.

2. The electronic semiconductor component according to claim 1, wherein the optical contrast of the marking is increased by the auxiliary layer.

3. The electronic semiconductor component according to claim 1, in which the marking penetrates the auxiliary layer in such a way that underlying regions of the housing structure are exposed.

4. The electronic semiconductor component according to claim 1, in which the auxiliary layer comprises ablation marks of a laser ablation process.

5. The electronic semiconductor component according to claim 1, in which the optical property is the average absorption or maximum absorption in a predetermined wavelength range.

6. The electronic semiconductor component according to claim 1, in which the cavity is at least 100 μm deep.

7. The electronic semiconductor component according to claim 1, in which the auxiliary layer is formed with at least one of the following materials: resin, silicone, plastic.

8. The electronic semiconductor component according to claim 1, in which the auxiliary layer comprises a dark grey or black appearance.

9. The electronic semiconductor component according to claim 1, in which the auxiliary layer is formed as a molded layer.

10. A method for producing an electronic semiconductor component according to claim 1, wherein the auxiliary layer is placed in the cavity by one of the following methods: jetting, dispensing, doctor blading, molding.

11. A method for producing an electronic semiconductor component according to claim 1, wherein the housing structure and the auxiliary layer are produced in a single method step.

12. A production of an electronic semiconductor component with a housing structure according to claim 1, wherein
- a marking is introduced into the cavity of the housing structure by means of a laser ablation process, and
- the marking is read and processed automatically.

13. An electronic semiconductor component with
- a housing structure,
- a cavity inserted into the housing structure, which comprises a base surface,
- an auxiliary layer disposed on the base surface of the cavity, and
- a marking penetrating the auxiliary layer to at least the base surface of the cavity, wherein the marking comprises an optical contrast which depends on both an optical property of the housing structure and an optical property of the auxiliary layer,
- wherein the electronic semiconductor component is an optoelectronic semiconductor component intended for emission or detection of electromagnetic radiation.

* * * * *